(12) United States Patent
Nguyen

(10) Patent No.: US 6,496,059 B1
(45) Date of Patent: Dec. 17, 2002

(54) CLAS-N AMPLIFER (76) Inventor: Tranh T. Nguyen, 1552 Magnolia Ave., Rohnert Park, CA (US) 94928

( * ) Notice: Subject to any disclaimer, the term of this patent is extended or adjusted under 35 U.S.C. 154(b) by 68 days.

(21) Appl. No.: 09/715,347

(22) Filed: Nov. 17, 2000

(51) Int. Cl.⁷ .......................... H03F 3/38; H03F 21/00; H03F 3/217
(52) U.S. Cl. ................. 330/10; 330/207 A; 330/251
(58) Field of Search .................. 330/10, 207 A, 330/251

(56) References Cited

U.S. PATENT DOCUMENTS 3,899,745 A * 8/1975 Fletcher et al. ............. 330/251
4,573,018 A * 2/1986 Mirow ......................... 330/10
5,834,857 A * 11/1998 Abe et al. ..................... 307/43
6,031,362 A * 2/2000 Bradley ...................... 323/267
6,323,796 B1 * 11/2001 Krone et al. ................ 341/143

* cited by examiner

Primary Examiner—Patricia Nguyen (57) ABSTRACT

A family of power amplifiers called class-N amplifiers comprising a modulator, a pulse-transmitting means, a power switch, a power transformer, and a synchronous demodulator. The modulator produces both PWM pulses and polarity pulses sent via pulse-transmitting means to the power switch to modulate an unregulated DC supply voltage electrically isolated from the amplifier's input and output, and to the synchronous demodulator. The power transformer transmit modulated voltage to the synchronous demodulator, which drives a load. There is no intermediary DC voltage in the amplifiers which operate in ternary mode.

20 Claims, 6 Drawing Sheets

CLAS-N AMPLIFER

BACKGROUND OF THE INVENTION

The present invention relates in general to audio amplifiers and in particular a method and apparatus for obtaining power supply isolated high power audio.

Audio circuits are well known in the prior art and generally utilize an audio amplifying circuit to drive the audio speaker. The audio amplifier is required to have a power audio stage. Such power amplifier circuits are illustrated in U.S. Pat. Nos. 4,409,559 and 4,651,112.

A typical class AB audio amplifier has an isolated power supply and the audio amplifier. The cost of these two units together is significant in the manufacture of an audio output device. There are many switching power amplifiers that attempt to increase power efficiency over class AB. Such circuits are shown in U.S. Pat. Nos. 4,763,080, 4,517,522, 4,047,120 and 4,453,131. These still need an isolated power supply, unipolar or bipolar.

U.S. Pat. No. 5,986,498 teaches an audio amplifier using two transformers for isolating main voltage from the output circuitry. However it has a few flaws and drawbacks: its embodiment as disclosed involves two switching transistors driven by a transformer and an input signal zero-voltage crossing detector, and a phase-lag network. Its two MOSFETs are one too many. Driving MOSFETs with a transformer is slow and difficult due to its leakage inductance and the need for flux balancing. The zero-voltage crossing of the input signal does not coincide with the zero-voltage crossing of the output voltages due to delays in the modulator, switching delays of the MOSFETs, and rise time of the transformers, and characteristics of the load. Furthermore, a phase lag network reduces the bandwidth of the amplifier and therefore increases its distortion especially for high frequencies. Most importantly, '498 teaches an amplifier incapable of driving a reactive load which audio speakers normally are, because the rectifiers at its output only allow unidirectional current flow, whereas a reactive load needs to dump its reactive energy to the source during portions of a sine wave.

What is needed is a power supply isolated switch-mode amplifier capable of driving any load, capable of high bandwidth and low distortion in addition to high efficiency, small size and weight, and low cost.

SUMMARY OF THE INVENTION

In accordance with the present invention a novel and useful class-N amplifier is herein provided.

This invention is a family of class-N amplifiers where the functions of a power converter such as an AC-to-DC switch-mode converter or a boost converter are integrated into the circuitry of a switching amplifier to produce a high power signal. The output section of a class-N amplifier is inherently electrically isolated from the power source such as rectified AC voltage for personal safety purposes via a high-frequency power transformer. The invention can be briefly described as a combination of a power modulator transmitting modulated power via a power transformer, followed by a synchronous demodulator driving a speaker. The modulator modulates the power supply voltage with pulse-width modulated (PWM) pulses. A power transformer transmits the modulated voltage to a synchronous demodulator, which reconstructs both phase and amplified amplitudes of the input signal, and filters out carrier frequencies to provide power audio signal to a speaker. Feedback circuits force faithful reproduction of the output signal with minimum distortion.

OBJECTS AND ADVANTAGES

It is therefore an object of the present invention to provide an efficient and simple method and apparatus for amplifying an audio signal into high power signal with high efficiency and with isolation from power source.

Another object of the present invention is to provide a method and apparatus for amplifying and driving an audio signal into any reactive load with high efficiency.

A further object of the present invention is to provide a class-N amplifier in which heat generation is substantially reduced during its operation.

Another object of the present invention is to provide a class-N amplifier which is amenable to miniaturization and, thus, is useful in audio systems, computers, and any other devices where minimal heat generation and minimal electromagnetic interference generation are criteria.

Another object of the present invention is to provide a class-N amplifier which possesses a high level of reliability due to low component count.

Further objects and advantages of this invention will become apparent from a consideration of the drawings and ensuing description.

DETAILED DESCRIPTION OF THE PREFERRED EMBODIMENTS

Figure 1:
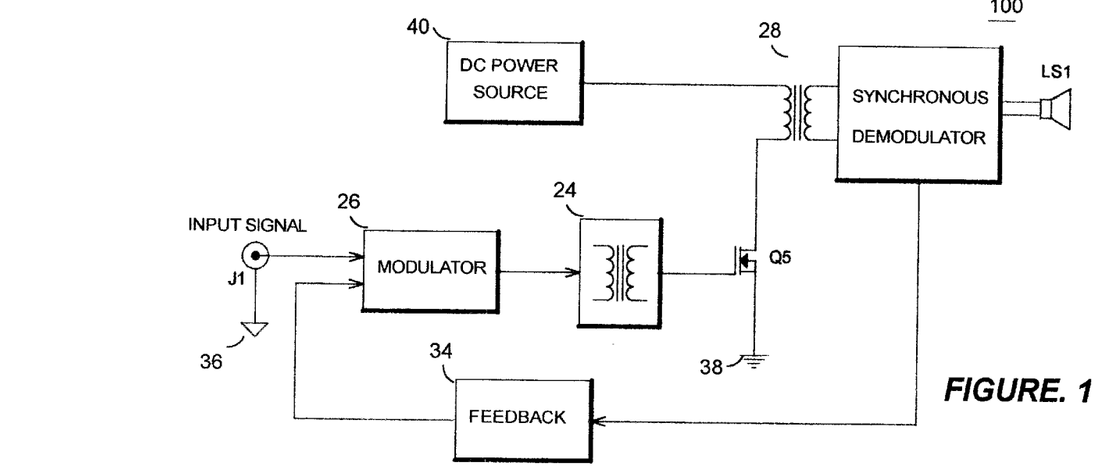
FIG. 1 is a block diagram of the audio amplifier of the present invention.
Figure 2:
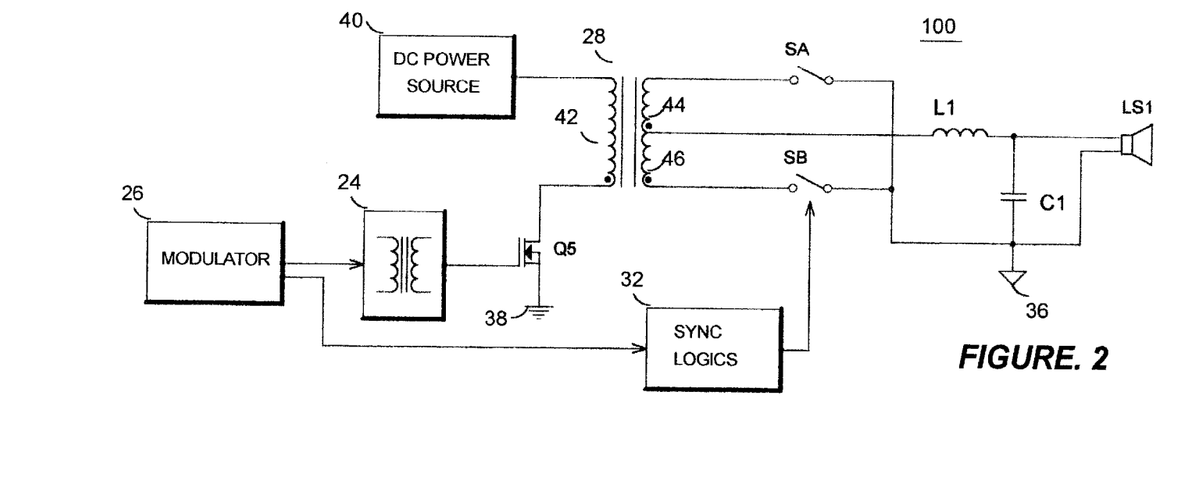
FIG. 2 is a block diagram of a first embodiment the audio amplifier of the present invention.

In a first embodiment, FIG. 1, a modulator 26 having for inputs the input signal J1 and a feedback signal 52 produces PWM pulses and synchronizing pulses. The PWM pulses are sent to a power switch Q5 via an isolated pulse transmission means such as a pulse transformer 24 or an opto-coupler. The power switch Q5 modulates a DC power source 40 into modulated voltage that a power transformer 28 transmits to a synchronous demodulator 100 with electrical isolation. The PWM pulses and synchronizing pulses in various combinations are also sent to the synchronous demodulator 100. A feedback signal 52 is taken from the demodulator 100 to make the modulator 26 adjust its modulation to achieve minimum distortion of the output signal. An embodiment of the synchronous demodulator 100 is shown in FIG. 2 where the switches SA and SB are bidirectional switches controlled by signals from a synchronizing logics block 32. The synchronizing logics 32 and a low-pass filter comprising the inductor L1 and capacitor C1 can be considered as part of the synchronous demodulator 100. Ground reference 36 of the input signal J1 and output section is isolated from the ground reference 38 of the DC power source 40 and power switch Q5. In FIG. 2 the input block and the feedback block are omitted for simplicity of the drawing. The switches SA and SB are complementary, i.e. their combined duty ratio is 1. When the switch SA is synchronous with the power switch Q5 the voltage on the speaker LS1 is positive. Likewise when the switch SB is synchronous with the power switch Q5 the voltage on the speaker LS1 is negative. The duty ratio of the power switch Q5 determines the amplitude of the speaker voltage. The bidirectional nature of the switches SA and SB allows bidirectional transfer of energy from and to the DC power source 40 to the speaker LS1, which is normally highly reactive, or more specifically, inductive.

Figure 3:
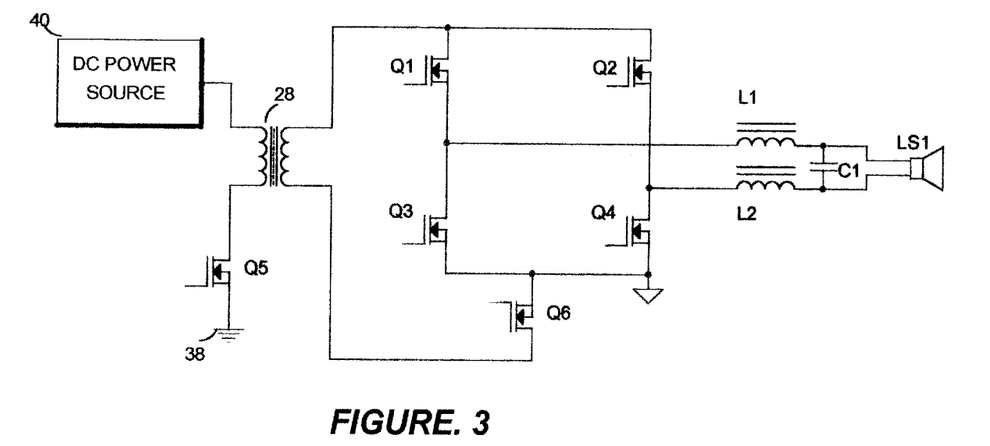
FIG. 3 is a block diagram of a second embodiment the audio amplifier of the present invention.
Figure 3B:
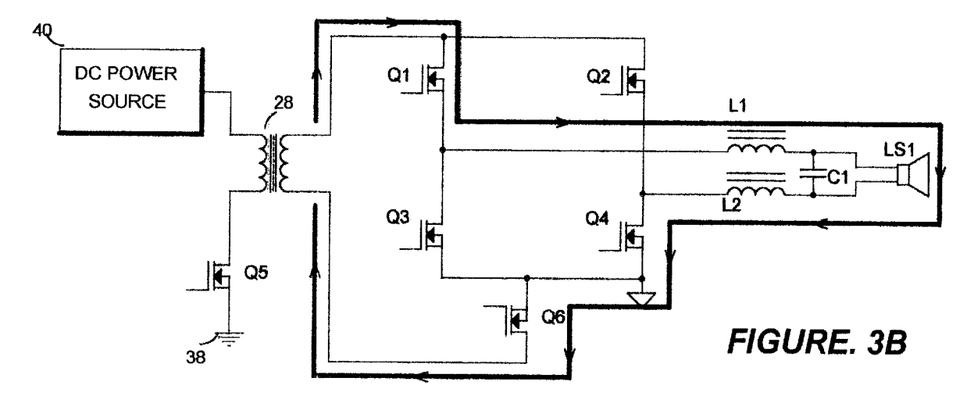
Figure 3C:
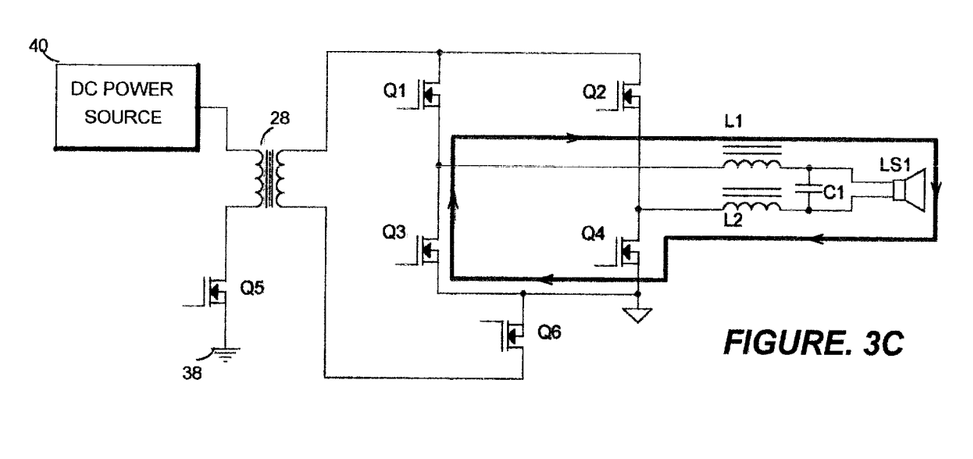
Figure 3D:
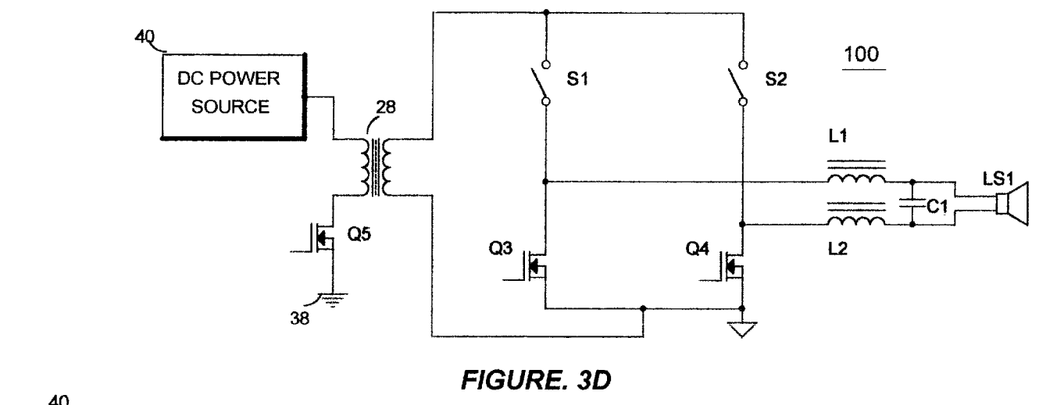

In a second embodiment illustrated in FIG. 3, a conventional H-bridge comprising four MOSFET Q1–Q4 and a fifth MOSFET Q6 are used to demodulate the PWM pulses. This H-bridge operates in tri-state or ternary mode. The switches Q6 and Q5 are synchronous with the switch Q1 when the input signal is positive. They are synchronous with the switch Q2 when the input signal is negative. The switch Q3 is complementary to the switch Q1, and Q4 complementary to Q2. FIG. 3B illustrates the flow of the current for a positive input signal when the switches Q1–Q4–Q6–Q5 are on. FIG. 3C illustrates the flow of the current for a positive input signal when the switches Q6–Q5 are off, therefore only the switches Q3–Q4 are on. This H-bridge with the extra switch Q6 is also capable of bidirectional energy transfer from and to the DC power source 40. The reader will note that the four MOSFETs Q3–Q6 are ground referenced therefore they are easy to drive. The MOSFET Q6 can be located on the top side of the H-bridge without changing the circuit behavior. However, such a floating location will require a floating gate drive circuit. Alternatively, the MOSFET Q6 can be combined with the MOSFETs Q1–Q2 in becoming two bidirectional switches S1–S2, which require only two floating gate drives, as illustrated in FIG. 3D. Its presence in the circuit, instead of a rectifier, is necessary, to allow bidirectional energy transfer already explained earlier. Thus as the reader can see, a modified H-bridge with two bidirection switches and two MOSFETs in combination with an LC filter comprising L1–L2–C1 operating in ternary mode is a preferred embodiment of the demodulator 100. The absence of rectifiers, filters, snubbers, a PWM control circuit and its linear feedback network is what distinguishes this invention from a conventional class-D amplifier and its power supply. Obviously the modified H-bridge can also operate as a class-D amplifier with its higher distortion and EMI due to the 50% duty ratio at zero input signal, with constant bidirectional energy exchange between the primary side and secondary side of the power transformer 28, which results in lower efficiency.

Figure 4:
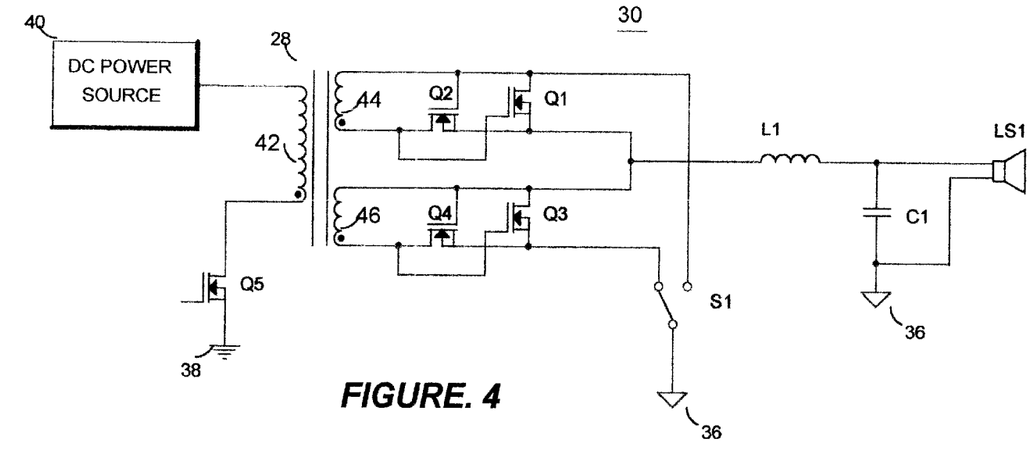
FIG. 4 is a third embodiment the audio amplifier of the present invention.

FIG. 4 illustrates a third embodiment of the synchronous demodulator 100 where the single-throw-double-pole switch S1 acts upon the polarity of the input signal while the MOSFETs Q1–Q4 act upon the amplitude of the signal. Again the MOSFET Q2 and Q4 are synchronous to Q5, the MOSFETs Q1 and Q3 are their complementary. The switch S1 is normally implemented with two MOSFETs, one N-channel and one P-channel.

Figure 4B:
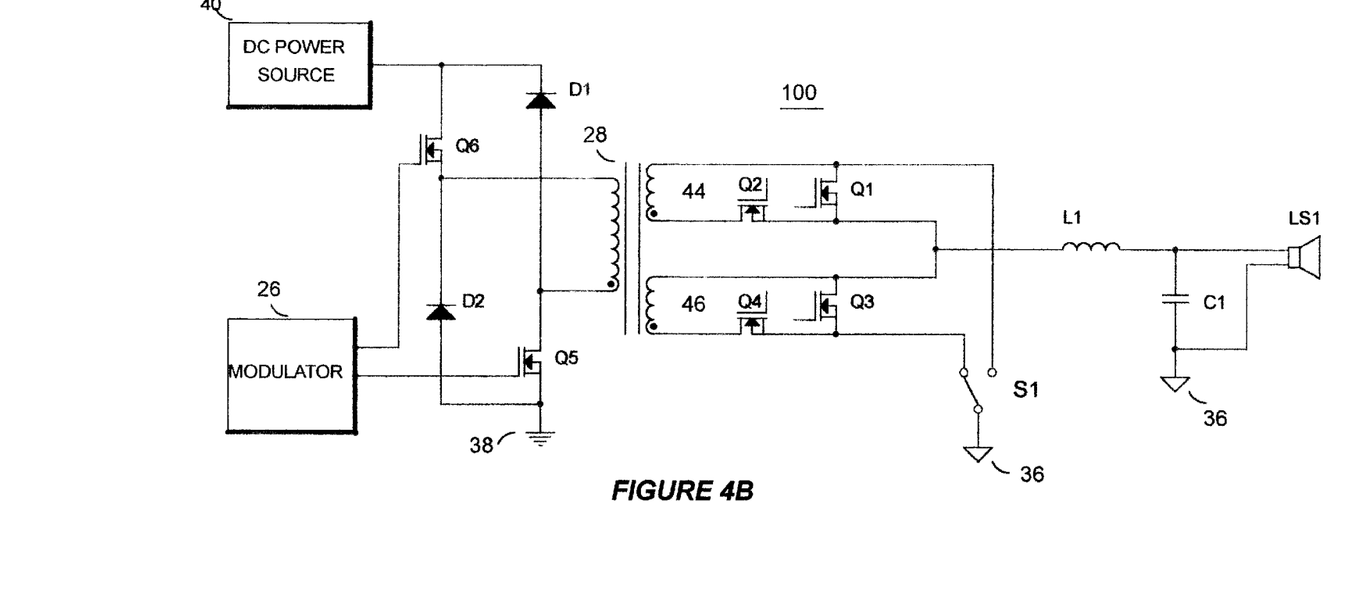

In the above embodiments, the power switch Q5 creates a unidirectional voltage on the secondary windings of the power transformer 28, and the regeneration of bipolar output voltage is done by using a polarity signal representing the polarity of the input signal J1. Drawbacks of such a power switch Q5 are the difficult processing of the energy in the leakage inductance of the transformer 28—often by lossy heat dissipation—and the resetting of the magnetic core of the transformer 28. A two-switch configuration of power switch also known as asymetrical half bridge will alleviate those problems by returning that energy to the source, as illustrated in FIG. 4B.

Figure 5:
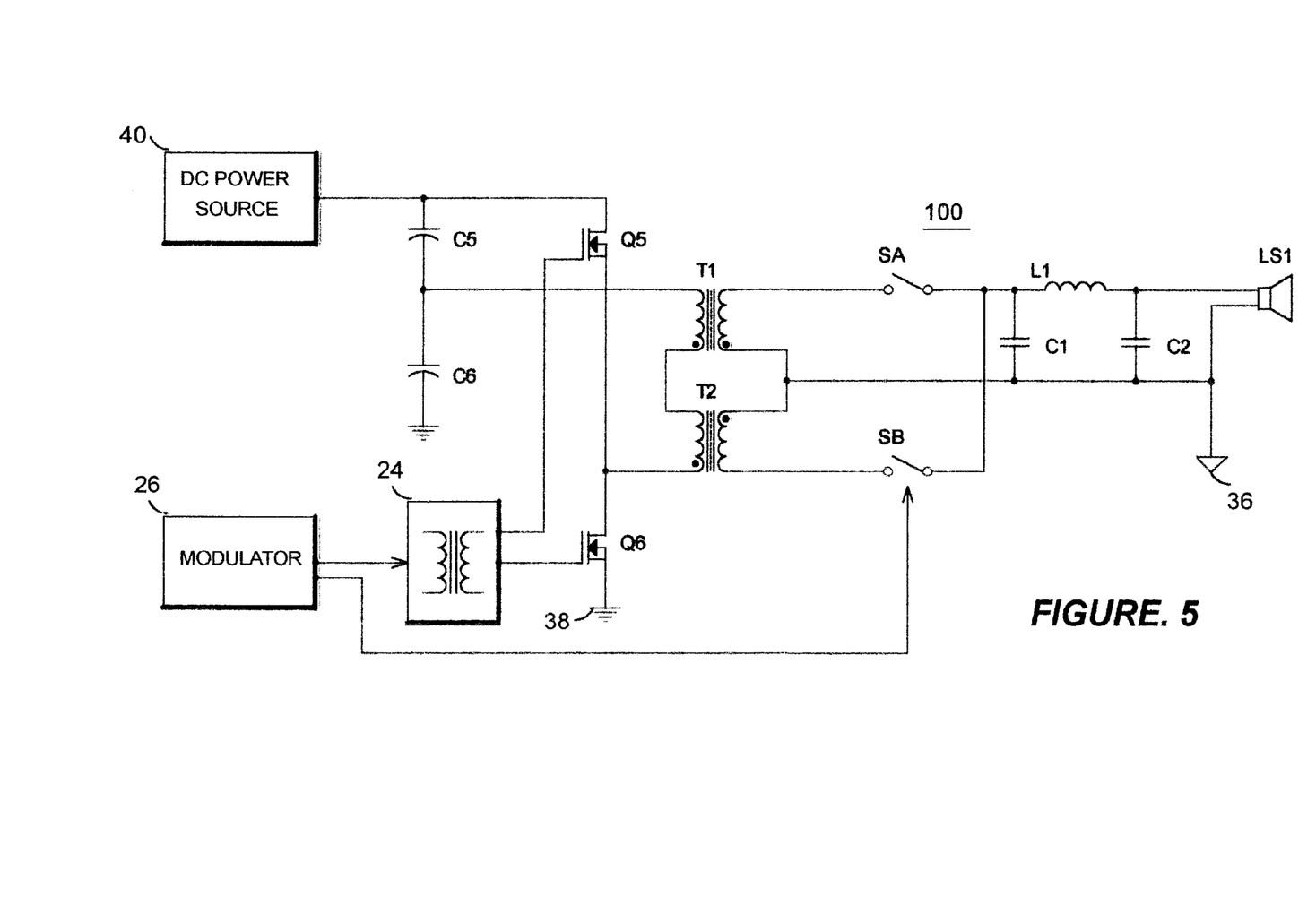
FIG. 5 shows a fourth embodiment the audio amplifier of the present invention.

In a fourth embodiment, FIG. 5, two MOSFETs Q5–Q6 are used in a novel way to perform the return of the energy of the leakage inductances of transformer T1 and the flyback transformer T2, and the resetting of these transformers. In this embodiment, the polarity signal determines which of the two MOSFETs Q5–Q6 will operate while the other is in high imedance state or inactive. Not only the return of leakage energy and the resetting of the transformers via the body diode of the other MOSFET are easy and automatic but now the bidirectional switches of the demodulator SA–SB are controlled directly by the modulator 26 without using a polarity signal, resulting in simple driving of these switches and very small delays between the switching of the modulator 26 and the switches SA–SB, which is desirable in a fast and low cost switching system. The return of energy in the transformers' leakage inductances is increasingly important as the switching frequency is set desirably higher to reduce the distortion of a switching amplifier. Thus this embodiment is very advantageous in many aspects including a single secondary Winding of the transformers T1–T2, low voltage stress of the switches Q5–Q6, high energy efficiency, and simple and fast control logics. While appearing to be similar to a half-bridge power switch, this combination of two MOSFETs and two transformers is functionally different because only of the MOSFETs Q5 or Q6 is switching at a time during which the input signal does not change polarity, and because the flyback transformer T2—or more properly called coupled inductor T2—acts as a current-smoothing inductor of this buck-family topology with lower ohmic losses than an output choke, due to lower primary current.

Figure 6:
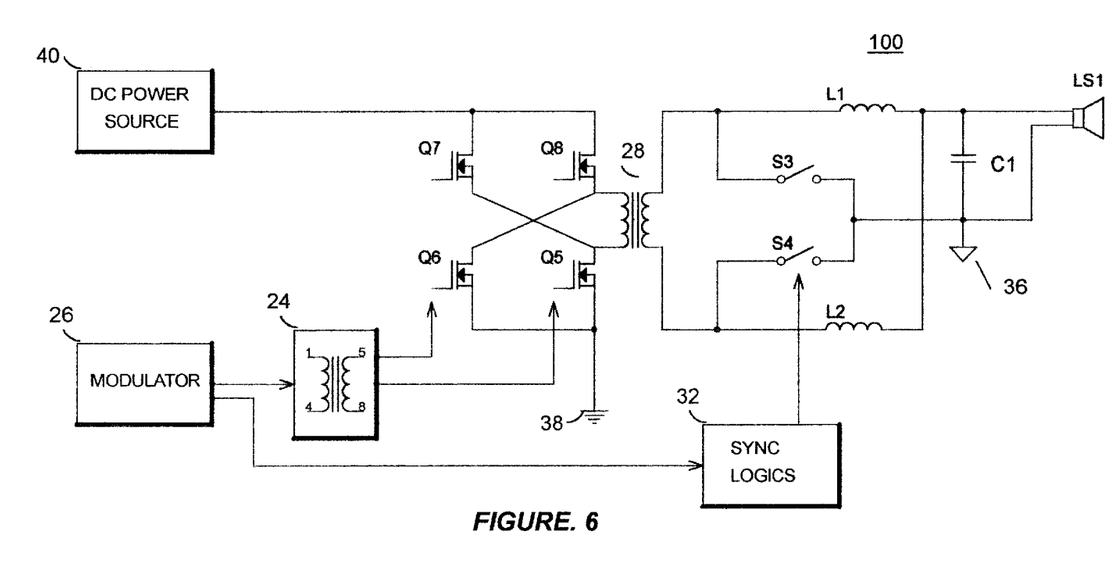
FIG. 6 is a fifth embodiment the audio amplifier of the present invention.

In a fifth embodiment, FIG. 6, the power switch is now a conventional H-bridge with 4 MOSFETs Q5–Q8, and the synchronous demodulator 100 comprises two overlap-conducting bidirectional switches S3–S4, two inductors L1–L2, and a filter capacitor C1. This embodiment is particularly suitable for very high power. The switches are synchronous and/or complementary with each others, as in other embodiments. Similary a half-bridge power switch or a push-pull power switch can be used in the DC power sourse side, in conjunction with this topology of the synchronous demodulator 100.

Figure 7:
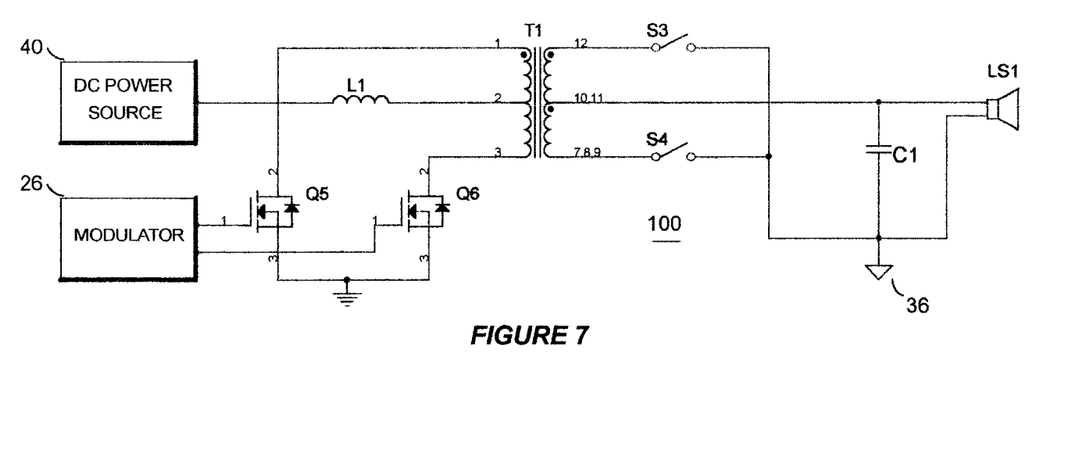
FIG. 7 is a block diagram of the sixth embodiment of the amplifier of the present invention.

In a sixth embodiment, FIG. 7, the power switch is now a current-fed push-pull stage with 2 MOSFETs Q5–Q6, and the synchronous demodulator 100 comprises two bidirectional switches S3–S4, and a filter capacitor C1. The current to the output is controlled by the inductor L1 now located in the primary side.

In all the embodiments, the modulator controls the switching times and state of all the switches, including the power switches on the primary side of the power transformer 28. The implementation of such a PWM modulator is subject of another patent application titled "PWM controller with one-cycle response" by the same inventor. That controller is capable of controlling a binary switched variable or a tri-state variable, the latter is what the described embodiments of the present inventions are, and the resulting amplifiers are capable of very high bandwidth exceeding 20 kHz, low distortion, high efficiency, and low cost. It is obvious that there are relationships between the modulator 26, the synchronous demodulator 100, the allowable configurations of the power switch Q5 or its equivalents, and the construction of the power transformer 28. The two polarities of the input signal has to be dealt with, either in the synchronous demodulator 100, or in the combination of power switch/power transformer.

The reader can see that the amplifier of the present invention in its many embodiments requires fewer number of power components than prior art when both the power supply and the amplifier section are considered, resulting in low cost and high efficiency, and when required, it is also capable of very high power output at very high efficiency without the need of a regulated and isolated power supply. It boils down to processing power as few times as possible.

From the description above, a number of advantages of the invented method and apparatus of isolated amplification by modulating power supply voltage, transmitting modulated voltage over a transformer and synchronous demodulation become evident:

(a) The overall efficiency is very high because of few power processing components.

(b) The quiescent power is very low due to ternary mode of operation.

(c) The total number of power components is low compared to prior art circuits.

(d) The output stage is isolated from the DC power source.

(e) There is no regulated power supply with its own control circuit, rectifiers, filters, and all the usual power-wasting snubber circuits.

Summary, Ramification and Scope

Accordingly the reader can see that the invented method of modulation and synchronous demodulation by a simpler circuit called class-N amplifier results in higher efficiency, low component count, more compact, higher reliability, and lower cost amplifiers.

Although the above embodiments mention DC power source obtained from AC main voltage, a DC power source of any type is perfectly usable due to the step-up/step down capability of the power transformer. Indeed, in mobile or vehicular applications where only a low battery voltage is available yet high power is desired, the invented class-N amplifiers can be advantageously used instead of the conventional combination of a boost converter and an H-bridge amplifier. In a near future when a 36-volt or 42-volt battery is used for vehicle electrical systems, again the built-in power conversion function of the high-efficiency and compact class-N amplifiers will be appreciated.

Those skilled in the art of switch-mode power supplies (SMPS) can readily recognize a portion of the invented class-N amplifier as a portion of a SMPS. Therefore all the known topologies of SMPS besides the ones already mentioned could be used in circumstances where they could have some benefits over those mentioned in the preferred embodiments, even though commercially the other topologies are less likely to be manufactured because of their higher cost. Most technologies, topologies, modulation techniques such as PWM, hysteretic modulation, frequency modulation, applicable to SMPS are also applicable to class-N family of power amplifiers. Specifically, boost-family or buck-boost-family or Cuk-family or SEPIC or ZETA topologies can be used to implement a class-N amplifier, although they are not presented as preferred embodiments due to their lower natural bandwidth.

While the preferred embodiments of the present invention have been shown and described herein, it will be obvious that such embodiments are provided by way of example only. Numerous variations, changes, and substitutions will occur to those of skill in the art without departing from the spirit and scope of the invention herein. Therefore it must be understood that the illustrated embodiments have been set forth for the purposes of examples and it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

In addition to the equivalents of the claimed elements, obvious substitutions now or later known to one with ordinary skill in the art are defined to be within the scope of the defined elements.

Thus the scope of the invention should be determined by the appended claims and their legal equivalents, rather than by the examples given.

I claim:

1. A method for obtaining amplified signal of an input signal on user's side which is isolated from power supply voltage for driving a complex impedance load, comprising the steps of:

modulating a power supply voltage with the input signal via a pulse transmitting means and a power switch, transmitting said modulated voltage to user's side using at least one transformer, and demodulating synchronously by means of bidirectional switches said modulated voltage to obtain power signal to drive a load, wherein the bidirectional switches accommodate bidirectional power transfer required by the complex impedance load.

2. The method of claim 1, wherein the step of demodulating synchronously said modulated power comprises the steps of:

using bidirectional switches changing state synchronously with said modulator to obtain two outputs of opposite polarities, controlling a dual-pole single-throw switch synchronously with the polarity of the input signal to connect synchronously to one of said two outputs at a time to obtain power output, and filtering modulation frequencies from said power output.

3. The method of claim 1, wherein the step of demodulating synchronously said modulated power comprises the steps of:

controlling two bidirectional switches to change state synchronously with said modulator to obtain an output with proper amplitude and polarity, and filtering modulation frequencies from said output of said switches.

4. The method of claim 2, wherein said dual-pole single-throw switch is connected to a same ground reference on users side as one end of the load.

5. An apparatus for amplifying an input signal into a power output signal, both signals being on user's side and isolated from a power source, comprising:

a modulator receiving the input signal and a feedback signal to produce PWM pulses and polarity pulses, a pulse transmitting means for transmitting said PWM pulses with electrical isolation, a power switch controlled by said pulses of said modulator, a power transformer having a primary winding and secondary windings, said transformer under switching action of said power switch providing modulated voltages on said secondary windings on user's side, and a synchronous demodulator for demodulating said modulated signals and providing power output signal to a load, said synchronous demodulator being driven by said pulses of said modulator.

6. The apparatus of claim 5 wherein said synchronous demodulator comprises two bidirectional switches changing state synchronously with said pulses of said modulator.

7. The apparatus of claim 5 wherein said power switch comprises a MOSFET connected between said primary winding of said power transformer and ground reference of power supply side.

8. The apparatus of claim 5 wherein said power switch comprises a first MOSFET connected between a first end of said primary winding and ground reference, and a second MOSFET connected between a second end of said primary winding and power supply voltage.

9. The apparatus of claim 5 wherein said demodulator comprises four MOSFETs forming an H-bridge and a fifth MOSFET synchronous to said power switch.

10. The apparatus of claim 5 wherein said demodulator comprises two bidirectional switches and two MOSFETs in a H-bridge configuration.

11. The apparatus of claim 5 wherein said demodulator comprises two bidirectional switches and a filter, said two bidirectional switches being connected to said secondary winding and at their common point connected to one end of the load, and said filter comprising two inductors having their common point connected to the other end of the load and their separate ends to two ends of the secondary winding at its two ends, said two bidirectional switches being synchronous to said power switch.

12. The apparatus of claim 11 wherein said two bidirectional switches have periods of overlapping conduction.

13. The apparatus of claim 5 wherein said power switch comprises four MOSFETs forming an H-bridge with said primary winding.

14. The apparatus of claim 5 wherein said power switch comprises two ground-referenced MOSFETs driving a center-tapped transformer.

15. The apparatus of claim 5 wherein said power switch comprises two MOSFETs connected in series with their common point connected to said primary winding.

16. An apparatus for amplifying an input signal into a power output signal, both signals being on user's side and isolated from a power source, comprising:

a modulator receiving the input signal and a feedback signal to produce PWM pulses and polarity pulses, a pulse transmitting means for transmitting said pulses of said modulator with electrical isolation, a power switch controlled by said pulses of said modulator, comprising a first MOSFET and a second MOSFET in series, a coupled inductor and a transformer having their primary windings in series, a synchronous demodulator comprising a pair of complementary bidirectional switches and a filter, wherein said first MOSFET operates when the input signal is positive, and said second MOSFET operates when the input signal is negative, and wherein said synchronous demodulator operates in ternary mode under alternating operation of said power switch to drive a load.

17. The apparatus of claim 5 wherein said modulator is a PWM modulator with one-cycle response.

18. The apparatus of claim 5 wherein said modulator is a hysteretic modulator.

19. The apparatus of claim 5 wherein said modulator is a phase-shifted modulator.

20. The apparatus of claim 16 wherein said modulator is a hysteretic modulator.

* * * * *